United States Patent
Ding et al.

(10) Patent No.: US 11,289,369 B2
(45) Date of Patent: Mar. 29, 2022

(54) LOW-K DIELECTRIC WITH SELF-FORMING BARRIER LAYER

(71) Applicant: Applied Materials, Inc., Santa Clara, CA (US)

(72) Inventors: Yi Ding, Campbell, CA (US); Shaunak Mukherjee, San Jose, CA (US); Bo Xie, San Jose, CA (US); Kang Sub Yim, Palo Alto, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 4 days.

(21) Appl. No.: 16/895,541

(22) Filed: Jun. 8, 2020

(65) Prior Publication Data
US 2020/0388532 A1    Dec. 10, 2020

Related U.S. Application Data

(60) Provisional application No. 62/859,087, filed on Jun. 8, 2019.

(51) Int. Cl.
*H01L 21/768* (2006.01)
*H01L 21/02* (2006.01)
*H01L 21/3215* (2006.01)

(52) U.S. Cl.
CPC .... *H01L 21/76829* (2013.01); *H01L 21/0234* (2013.01); *H01L 21/02274* (2013.01); *H01L 21/3215* (2013.01); *H01L 21/76826* (2013.01)

(58) Field of Classification Search
CPC ......... H01L 21/76829; H01L 21/02274; H01L 21/0234; H01L 21/76826; H01L 21/3215; H01L 21/76834; H01L 21/76828; H01L 21/02126
See application file for complete search history.

(56) References Cited

U.S. PATENT DOCUMENTS

| | | | |
|---|---|---|---|
| 7,611,996 B2 | 11/2009 | Schmitt et al. | |
| 2005/0048795 A1* | 3/2005 | Ko | H01L 21/02282 438/778 |
| 2006/0043591 A1 | 3/2006 | Yim et al. | |
| 2006/0144334 A1 | 7/2006 | Yim et al. | |
| 2008/0099920 A1 | 5/2008 | Schmitt et al. | |
| 2008/0160782 A1 | 7/2008 | Yamazaki et al. | |
| 2010/0029078 A1 | 2/2010 | Russell et al. | |
| 2010/0096273 A1 | 5/2010 | Luo et al. | |
| 2013/0181240 A1* | 7/2013 | Chen | H01L 33/005 257/94 |
| 2017/0005041 A1 | 1/2017 | Ren et al. | |
| 2017/0352590 A1* | 12/2017 | Yang | H01L 21/76849 |
| 2018/0274097 A1* | 9/2018 | Lei | C23C 16/345 |

OTHER PUBLICATIONS

PCT International Search Report and Written Opinion in PCT/US2020/036583 dated Sep. 21, 2020, 11 pages.

* cited by examiner

*Primary Examiner* — Karen Kusumakar
(74) *Attorney, Agent, or Firm* — Servilla Whitney LLC

(57) ABSTRACT

A method of forming a low-k dielectric layer with barrier properties is disclosed. The method comprises forming a dielectric layer by PECVD which is doped with one or more of boron, nitrogen or phosphorous. The dopant gas of some embodiments may be coflowed with the other reactants during deposition.

19 Claims, 3 Drawing Sheets

LOW-K DIELECTRIC WITH SELF-FORMING BARRIER LAYER

CROSS-REFERENCE TO RELATED APPLICATIONS

This application claims priority to U.S. Provisional Application No. 62/859,087, filed Jun. 8, 2019, the entire disclosure of which is hereby incorporated by reference herein.

TECHNICAL FIELD

Embodiments of the present disclosure generally relate to methods of forming barrier layers with low dielectric constants.

BACKGROUND

Preventing the movement of elements from one material in an electronic device into another material has been a long recognized problem in the semiconductor art. Diffusion barriers have been developed to prevent the diffusion of large atoms, like metals.

Interconnect structures in semiconductors often contain a barrier layer to prevent diffusion of the metal into the dielectric. A typical interconnect may comprise a stack of $Cu/Ta/TaN/SiO_2$, in which the Ta/TaN layers are a barrier layer, functionally preventing the diffusion of Cu into the dielectric.

With the reduction of node dimensions, the increasing difficulty and complexity in fabricating the barrier layer demands novel materials to simplify the interconnect fabrication process. The current state-of-the-art process involves PVD of metal barrier layers (e.g., Ta/TaN), which is becoming increasingly difficult in smaller node dimensions. For smaller dimensions, novel materials are needed which allow for the removal of the intermediate barrier layer, instead modifying the diffusion properties of the metal and the dielectric. Without an intervening barrier layer, it is possible to form smaller interconnects. Similarly, removal of the intervening barrier layer would simplify production schemes.

Therefore, there is a need in the art for dielectric materials with increased barrier properties.

SUMMARY

One or more embodiments of the disclosure are directed to a method for forming a dielectric barrier layer comprising exposing a substrate having a metal surface thereon to a dopant gas to provide a layer of dopant on the metal surface. The dopant gas comprises at least one species with atoms of a group Ill or group V element. A doped dielectric layer is deposited by exposing the substrate to a silicon precursor, the dopant gas and a plasma to form a doped dielectric layer. The doped dielectric layer is annealed to form a dielectric barrier layer.

Additional embodiments of the disclosure are directed to a method for forming a dielectric barrier layer comprising depositing a dielectric layer on a substrate having a copper surface thereon by exposing the substrate to a silicon precursor, a dopant gas and a plasma to form a doped dielectric layer. The dopant gas comprises one or more of boron atoms, phosphorous atoms or nitrogen atoms. The doped dielectric layer is annealed for a period in a range of about 60 min to about 120 min at a temperature less than about 500° C. in a molecular nitrogen ($N_2$) atmosphere to form a dielectric barrier layer.

Further embodiments of the disclosure are directed to a method for forming a dielectric barrier layer comprising exposing a substrate having a copper surface thereon to a dopant gas comprising diborane to form a treated surface. The dopant gas having a flow rate in a range of about 50 sccm to about 100 sccm. A dielectric layer is deposited on the treated surface by exposing the substrate to a silicon precursor, the dopant gas and a plasma to form a doped dielectric layer. The doped dielectric layer is annealed for a period in a range of about 90 min to about 120 min at a temperature less than about 500° C. in a molecular nitrogen ($N_2$) atmosphere to form a dielectric barrier layer. The dielectric barrier layer is exposed to a treatment plasma comprising ammonia.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
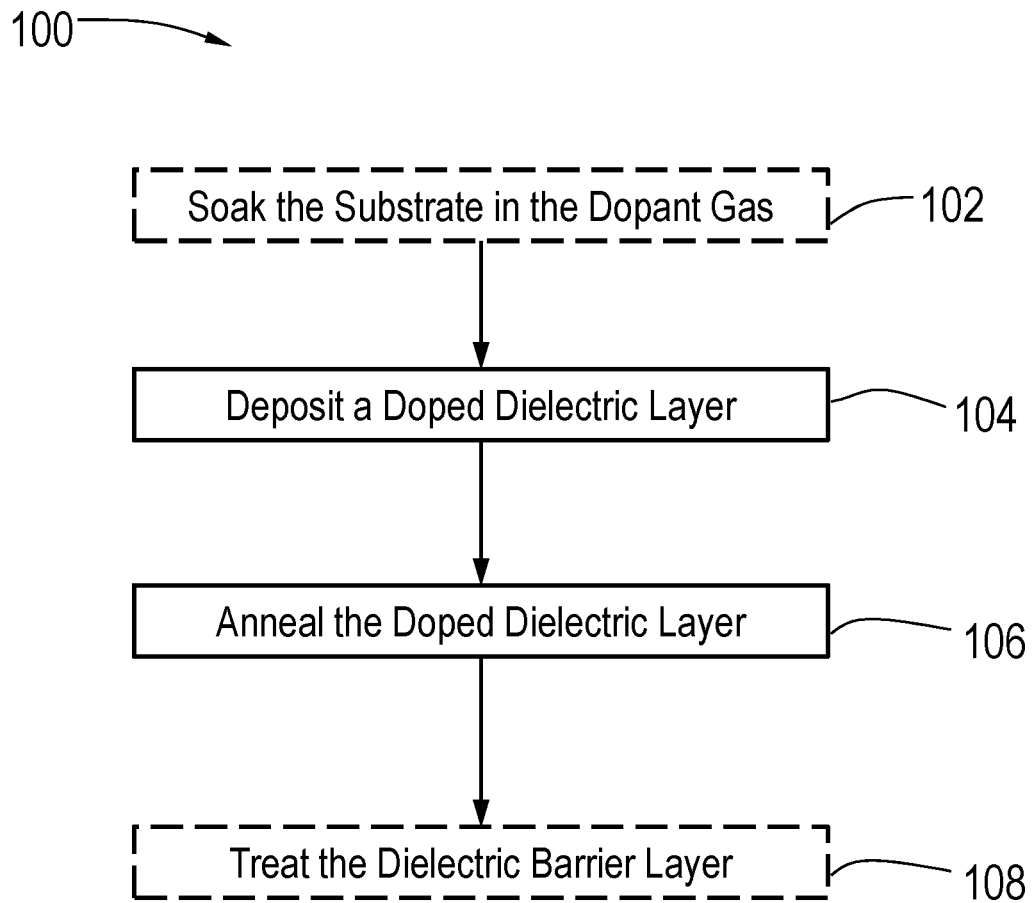
FIG. 1 is a flow chart of a method of forming a dielectric layer according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the present disclosure relate to methods for forming a low-k dielectric layer which acts as barrier layer. Some methods of this disclosure advantageously provide methods to simplify the barrier layer fabrication process by eliminating a PVD step. Some methods of this disclosure advantageously provide methods which provide low-k dielectric barrier layers for use as interlayer dielectrics with high hardness and stiffness.

Embodiments described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. The apparatus description described herein is illustrative and should not be construed or interpreted as limiting the scope of the disclosure.

Figure 2:
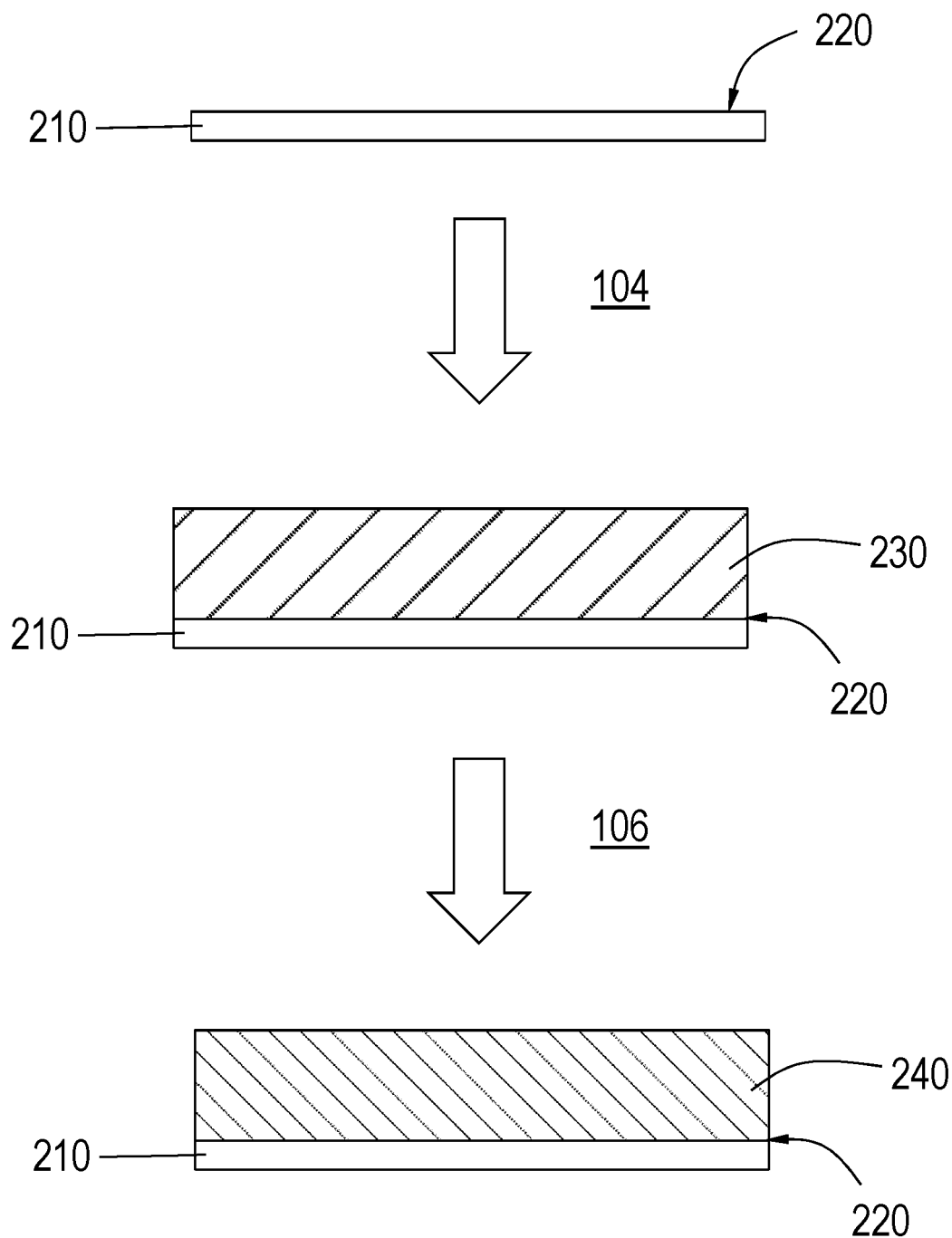
FIG. 2 illustrates an exemplary electronic device according to one or more embodiment of the disclosure.

Referring to FIGS. 1 and 2, in some embodiments, the method 100 of forming a low-k dielectric barrier layer 240 begins at operation 104 by depositing a doped dielectric layer 230 on a metal surface 220 of a substrate 210. The metal surface 220 can have any suitable metal species. In some embodiments, the metal of the metal surface 220 comprises copper.

The doped dielectric layer 230 is deposited by exposing the substrate 210 to a silicon precursor, a dopant gas and a plasma formed from a plasma gas. The silicon precursor, dopant gas and plasma are all exposed to the substrate simultaneously. Stated differently, the operation 104 may be referred to as a plasma-enhanced chemical vapor deposition (PECVD) process. In some embodiments, one or more of the silicon precursor, the dopant gas and the plasma gas may be co-flowed into a processing chamber together.

Embodiments of the disclosure provide a low-k dielectric barrier layer 240 which limits or prevents the diffusion of the metal from the metal surface 220 into the dielectric barrier layer 240. Without being bound by theory, the prevention of metallic diffusion into the dielectric barrier layer 240 eliminates or minimizes electrical shorts and device failure.

The dopant gas provides an atomic source of a group III or group V element in the doped dielectric layer 230. As used in this specification, a group III element is selected from the column of the periodic table beginning with boron (B) and a group V element is selected from the column beginning with nitrogen (N).

In some embodiments, the dopant gas comprises one or more of boron (B), phosphorous (P) or nitrogen (N). In some embodiments, the dopant gas comprises boron atoms. In some embodiments, the dopant gas comprises or consists essentially of diborane ($B_2H_6$). In some embodiments, the dopant gas comprises phosphorous atoms. In some embodiments, the dopant gas comprises or consists essentially of phosphine ($PH_3$). In some embodiments, the dopant gas comprises nitrogen atoms. In some embodiments, the dopant gas comprises one or more of molecular nitrogen ($N_2$), ammonia ($NH_3$), nitrogen dioxide ($NO_2$), nitric oxide (NO) and nitrous oxide ($N_2O$). In some embodiments, the dopant gas consists essentially of nitrogen ($N_2$), ammonia, $NO_2$, or $N_2O$. As used in this regard, the term "consists essentially of" means that the dopant gas consists of greater than or equal to about 95%, greater than or equal to about 98%, greater than or equal to about 99%, or greater than or equal to about 99.5% of the dopant gas, excluding any carrier or diluent gases on a molar basis.

The dopant gas may be supplied to the processing chamber at any suitable flow rate. In some embodiments, the dopant gas is supplied at a relatively low flow rate. In some embodiments, the dopant gas is flowed at a flow rate up to about 500 sccm. In some embodiments, the dopant gas is flowed at a flow rate in a range of about 10 sccm to about 500 sccm, about 20 sccm to about 200 sccm, or about 50 sccm to about 100 sccm.

The silicon precursor may be any suitable silicon precursor. The plasma gas may be any suitable plasma gas and used to produce any suitable plasma. In some embodiments, a diluent or carrier gas is also provided with one or more of the silicon precursor, the plasma gas or the dopant gas. In some embodiments, the silicon precursor comprises carbon and the plasma gas comprises oxygen. In these embodiments, the doped dielectric layer 230 may comprise a doped silicon oxycarbide (SiOC) layer. The skilled artisan will recognize that the use of formula such as SiOC to describe a thin film material does not imply any particular stoichiometric ratio of atoms. The formula merely provides an identification of the atoms making up the primary composition (i.e., greater than 90%, 95%, 98%, 99% or 99.5%) of the film.

The deposition rate of the doped dielectric layer 230 may be controlled. In some embodiments, the deposition rate of the doped dielectric layer is controlled in a range of about 500 Å/min to about 3000 Å/min.

In controlling the deposition rate of the doped dielectric layer 230, the thickness of the doped dielectric layer 230 and the dielectric barrier layer 240 may also be controlled. In some embodiments, the thickness of the doped dielectric layer and/or the dielectric barrier layer is in a range of about 150 nm to 300 nm. In some embodiments, the thickness of the doped dielectric layer and/or the dielectric barrier layer is less than or equal to about 300 nm, less than or equal to about 250 nm, less than or equal to about 200 nm, less than or equal to about 150 nm, or less than or equal to about 100 nm.

In some embodiments, the substrate is exposed to the dopant gas before the silicon precursor and the plasma. Referring again to FIGS. 1 and 2, the method 100 may optionally begin at 102 by exposing the substrate 210, including the metal surface 220, to the dopant gas. Stated differently, the substrate 210 may be soaked in the dopant gas prior to depositing the doped dielectric layer 230.

The method 100 continues at 106 by annealing the doped dielectric layer 230 to form a dielectric barrier layer 240. In some embodiments, the doped dielectric layer is annealed in an atmosphere comprising molecular nitrogen ($N_2$).

In some embodiments, the anneal process at 106 may be described as a low temperature anneal. In some embodiments, the doped dielectric layer 230 is annealed at a temperature of less than or equal to about 500° C., less than or equal to about 450° C., less than or equal to about 400° C., or less than or equal to about 350° C.

In some embodiments, the anneal process at 106 may be described as a long anneal. In some embodiments, the doped dielectric layer 230 is annealed for a period in a range of about 1 min to about 120 min, about 60 min to about 120 min, or about 90 min to about 120 min. In some embodiments, the doped dielectric layer is annealed for a period greater than or equal to about 1 min, greater than or equal to about 10 min, greater than or equal to about 30 min, greater than or equal to about 60 min, or greater than or equal to about 90 min.

The method 100 may end after 106. In some embodiments, the method 100 continues with optional process 108. At 108, the dielectric barrier layer 240 may be exposed to a treatment plasma to improve at least one of elasticity or hardness. In some embodiments, the treatment plasma improves the elasticity of the dielectric barrier layer 240. In some embodiments, the treatment plasma improves the hardness of the dielectric barrier layer 240.

The composition and parameters of the treatment plasma may be varied depending on the composition of the dielectric barrier layer 240. In some embodiments, the treatment plasma comprises nitrogen atoms. In some embodiments, the treatment plasma comprises or consists essentially of ammonia. In some embodiments, the ammonia is provided to the processing chamber at a flow rate in a range of about 1500 sccm to about 2000 sccm. In some embodiments, the ammonia is provided to the processing chamber at a flow rate of about 1600 sccm.

In some embodiments, the treatment plasma has a power in a range of about 250 W to about 500 W or in a range of about 350 W to about 450 W. In some embodiments, the treatment plasma has a power of about 400 W.

In some embodiments, the dielectric barrier layer is exposed to the treatment plasma for a period of less than or equal to about 30 s, less than or equal to about 20 s, less than or equal to about 15 s or less than or equal to about 10 s.

The dielectric barrier layer 240 is capable of limiting or preventing the diffusion of metal atoms from the metal surface 220 into the dielectric barrier layer. Similarly, with additional layers are deposited onto the dielectric barrier layer 240, the dielectric barrier layer is capable of limiting or preventing diffusion of metal atoms into these additional layers. The elimination of a traditional barrier layer (e.g., Ta/TaN) advantageously simplifies the production process flow and provides an electronic device with a reduced thickness.

FIG. 2 illustrates an exemplary substrate 210 during processing by method 100. Referring to FIGS. 1 and 2, the method 100 begins with a substrate 210 with a metal surface 220. At 104, a doped dielectric layer 230 is deposited on the metal surface 220. At 106, the doped dielectric layer 230 is annealed to form the dielectric barrier layer 240.

In some embodiments, operations 104 and 106 (and optionally operations 102 and 108) are clustered together in a clustered tool. In some embodiments, operations 104 and 106 and optional operations 102 and 108 are performed without breaking vacuum between consecutive operations. In some embodiments, the operations 102, 104, 106 and 108 are performed within a single processing environment.

Figure 3:
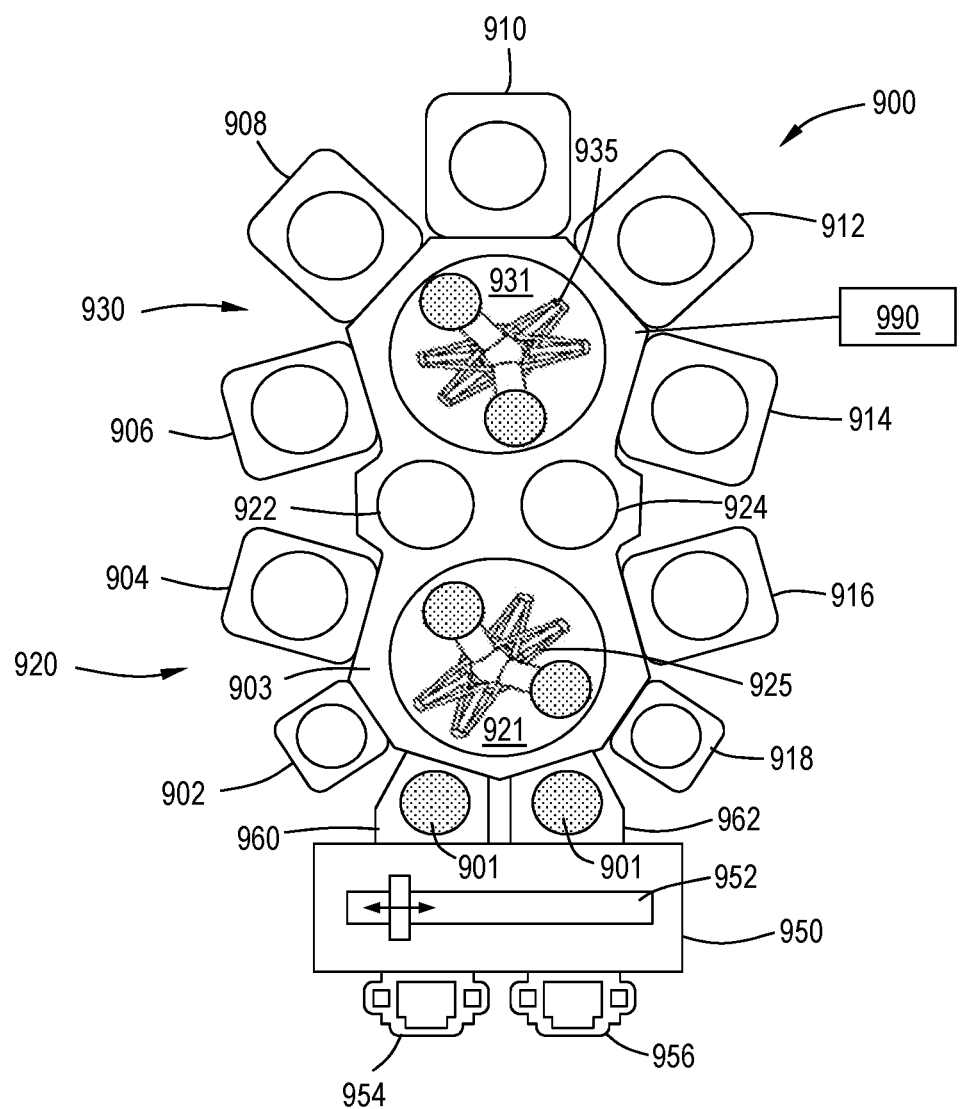
FIG. 3 illustrates a cluster tool according to one or more embodiment of the disclosure.

Additional embodiments of the disclosure are directed to processing tools for the methods described herein, as shown in FIG. 3. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station 921, 931. The various processing chambers provide separate processing regions isolated from adjacent process chambers. The processing chambers can be any suitable chamber including, but not limited to, a pre-clean chamber, a buffer chamber, transfer space(s), a wafer orienter/degas chamber, a cryo cooling chamber, a deposition chamber, an annealing chamber, an etching chamber, a thermal processing (RTP) chamber, a plasma treatment chamber, and an atomic layer deposition (ALD) chamber. The particular arrangement of process chambers and components can be varied depending on the cluster tool and should not be taken as limiting the scope of the disclosure.

In one or more embodiments, the cluster tool 900 includes a deposition chamber to deposit the doped dielectric layer 230. The deposition chamber of some embodiments comprises a PECVD deposition chamber. In one or more embodiments, the cluster tool 900 includes a soak chamber connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method for forming a dielectric barrier layer comprising:
    exposing a substrate having a copper surface thereon to a dopant gas to provide a layer of dopant on the copper surface, the dopant gas comprising at least one species with atoms of a group III or group V element;
    depositing a doped dielectric layer by exposing the substrate to a silicon precursor, the dopant gas and a plasma to form a doped dielectric layer; and
    annealing the doped dielectric layer to form a dielectric barrier layer.

2. The method of claim 1, wherein the dopant gas is flowed at a flow rate up to about 500 sccm.

3. The method of claim 1, wherein the dopant gas comprises boron atoms.

4. The method of claim 3, wherein the dopant gas consists essentially of diborane.

5. The method of claim 1, wherein the dopant gas comprises phosphorous atoms.

6. The method of claim 5, wherein the dopant gas consists essentially of phosphine.

7. The method of claim 1, wherein the dopant gas comprises nitrogen atoms.

8. The method of claim 7, wherein the dopant gas comprises one or more of nitrogen (N2), ammonia, NO2, and N2O.

9. The method of claim 1, wherein depositing the doped dielectric layer is performed by a plasma-enhanced chemical vapor deposition process utilizing a silicon precursor comprising carbon and a plasma gas comprising oxygen.

10. The method of claim 9, wherein the doped dielectric layer comprises a doped SiOC layer.

11. The method of claim 1, wherein annealing the doped dielectric layer is performed in an atmosphere comprising N2.

12. The method of claim 1, wherein the doped dielectric layer is annealed at a temperature of less than about 500° C.

13. The method of claim 1, wherein the doped dielectric layer is annealed for a period in a range of about 1 min to about 120 min.

14. The method of claim 1, further comprising exposing the dielectric barrier layer to a treatment plasma to improve at least one of elasticity and hardness.

15. The method of claim 14, wherein the treatment plasma comprises ammonia.

16. The method of claim 14, wherein the treatment plasma has a power in a range of about 250 W to about 500 W and the dielectric barrier layer is exposed for less than or equal to about 20 s.

17. A method for forming a dielectric barrier layer comprising:
depositing a dielectric layer on a substrate having a copper surface thereon by exposing the substrate to a silicon precursor, a dopant gas and a plasma to form a doped dielectric layer, the dopant gas comprising one or more of boron atoms, or phosphorous atoms; and
annealing the doped dielectric layer for a period in a range of about 60 min to about 120 min at a temperature less than about 500° C. in a nitrogen (N2) atmosphere to form a dielectric barrier layer.

18. The method of claim 17, further comprising exposing the dielectric barrier layer to a treatment plasma comprising ammonia to improve at least one of elasticity and hardness.

19. A method for forming a dielectric barrier layer comprising:
exposing a substrate having a copper surface thereon to a dopant gas comprising diborane to form a treated surface, the dopant gas having a flow rate in a range of about 50 sccm to about 100 sccm;
depositing a dielectric layer on the treated surface by exposing the substrate to a silicon precursor, the dopant gas and a plasma to form a doped dielectric layer;
annealing the doped dielectric layer for a period in a range of about 90 min to about 120 min at a temperature less than about 500° C. in a nitrogen (N2) atmosphere to form a dielectric barrier layer; and
exposing the dielectric barrier layer to a treatment plasma comprising ammonia.

* * * * *